(12) United States Patent
Wang et al.

(10) Patent No.: US 10,204,958 B2
(45) Date of Patent: Feb. 12, 2019

(54) INFRARED DETECTOR, INFRARED DETECTION SENSOR HAVING AN INFRARED DETECTOR AND METHOD OF MANUFACTURING THE SAME

(71) Applicant: Samsung Display Co., Ltd., Yongin-si, Gyeonggi-do (KR)

(72) Inventors: Seong-Min Wang, Yongin-si (KR); Byeong-Hoon Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/837,492

(22) Filed: Dec. 11, 2017

(65) Prior Publication Data

US 2018/0108701 A1 Apr. 19, 2018

Related U.S. Application Data

(62) Division of application No. 14/220,359, filed on Mar. 20, 2014, now Pat. No. 9,876,048.

(30) Foreign Application Priority Data

Nov. 7, 2013 (KR) ........................ 10-2013-0134564

(51) Int. Cl.
  *H01L 33/00* (2010.01)
  *H01L 21/00* (2006.01)
  *H01L 27/146* (2006.01)
(52) U.S. Cl.
  CPC .. *H01L 27/14649* (2013.01); *H01L 27/14632* (2013.01); *H01L 27/14687* (2013.01)

(58) Field of Classification Search
  CPC ............ H01L 29/7869; H01L 27/1225; H01L 27/124; H01L 27/1214; H01L 21/02675;
  (Continued)

(56) References Cited

U.S. PATENT DOCUMENTS

| 7,351,605 B2 | 4/2008 | Yonezawa et al. |
| 8,164,090 B2 | 4/2012 | Iwasaki et al. |

(Continued)

FOREIGN PATENT DOCUMENTS

| JP | 2010-251731 | 11/2010 |
| KR | 10-2008-0065517 | 7/2008 |

(Continued)

*Primary Examiner* — Mary Wilczewski
*Assistant Examiner* — Tsz Chiu
(74) *Attorney, Agent, or Firm* — Lewis Roca Rothgerber Christie LLP

(57) ABSTRACT

An infrared detector includes a substrate, a light blocking layer on the substrate, a lower electrode on the light blocking layer, the lower electrode electrically connected to the light blocking layer, a lower insulating layer on the light blocking layer, a first semiconductor layer on the lower insulating layer, a first source electrode and a first drain electrode on the first semiconductor layer, an upper insulating layer on the first semiconductor layer, and a first gate electrode on the upper insulating layer, the first gate electrode electrically connected to the lower electrode, where the first semiconductor layer includes a zinc and a nitrogen, and the first semiconductor layer is configured to generate electric charges by reacting with an infrared ray.

6 Claims, 14 Drawing Sheets

(58) Field of Classification Search
CPC .......... H01L 21/02678; H01L 21/2026; G02F 1/13338; G02F 2203/11; G06F 3/0412; G06F 3/042
See application file for complete search history.

(56) References Cited

U.S. PATENT DOCUMENTS

| | | |
|---|---|---|
| 8,274,078 B2 | 9/2012 | Itagaki et al. |
| 9,007,344 B2 | 4/2015 | Han et al. |
| 9,604,391 B2 | 3/2017 | Tamada et al. |
| 2001/0038065 A1 | 11/2001 | Kimura |
| 2004/0157432 A1 | 8/2004 | Yonezawa et al. |
| 2008/0121819 A1 | 5/2008 | Tanaka et al. |
| 2008/0164476 A1 | 7/2008 | Park et al. |
| 2010/0109058 A1* | 5/2010 | Sakata ............... C23C 14/0057 257/288 |
| 2010/0244020 A1 | 9/2010 | Sakata et al. |
| 2010/0301340 A1 | 12/2010 | Shih |
| 2011/0012115 A1 | 1/2011 | Jeon et al. |
| 2011/0057189 A1 | 3/2011 | Jeong |
| 2011/0263079 A1 | 10/2011 | Wang |
| 2012/0223303 A1 | 9/2012 | Ye |

FOREIGN PATENT DOCUMENTS

| | | |
|---|---|---|
| KR | 10-2010-0012783 | 2/2010 |
| KR | 10-2011-0062043 | 6/2011 |

* cited by examiner

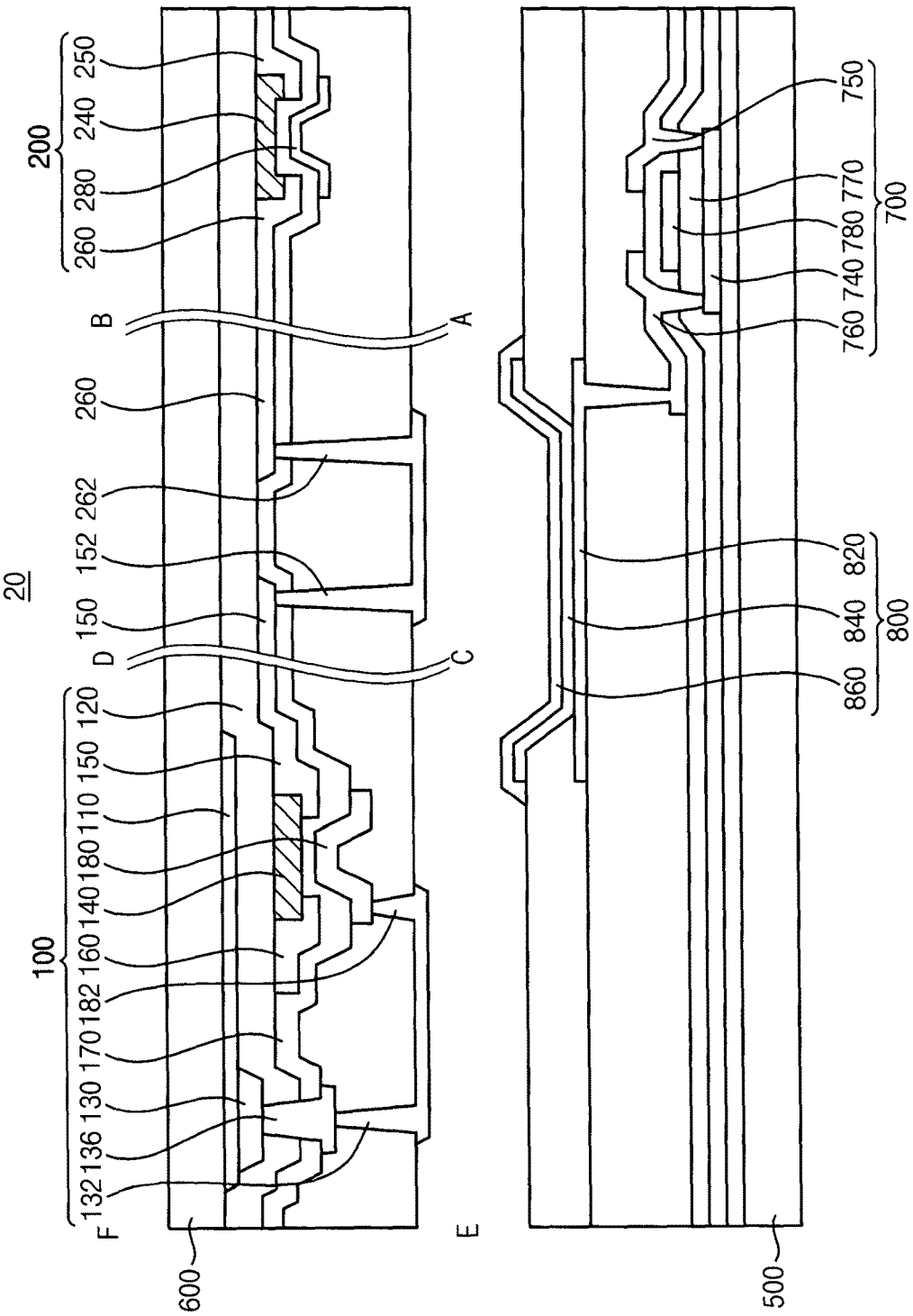

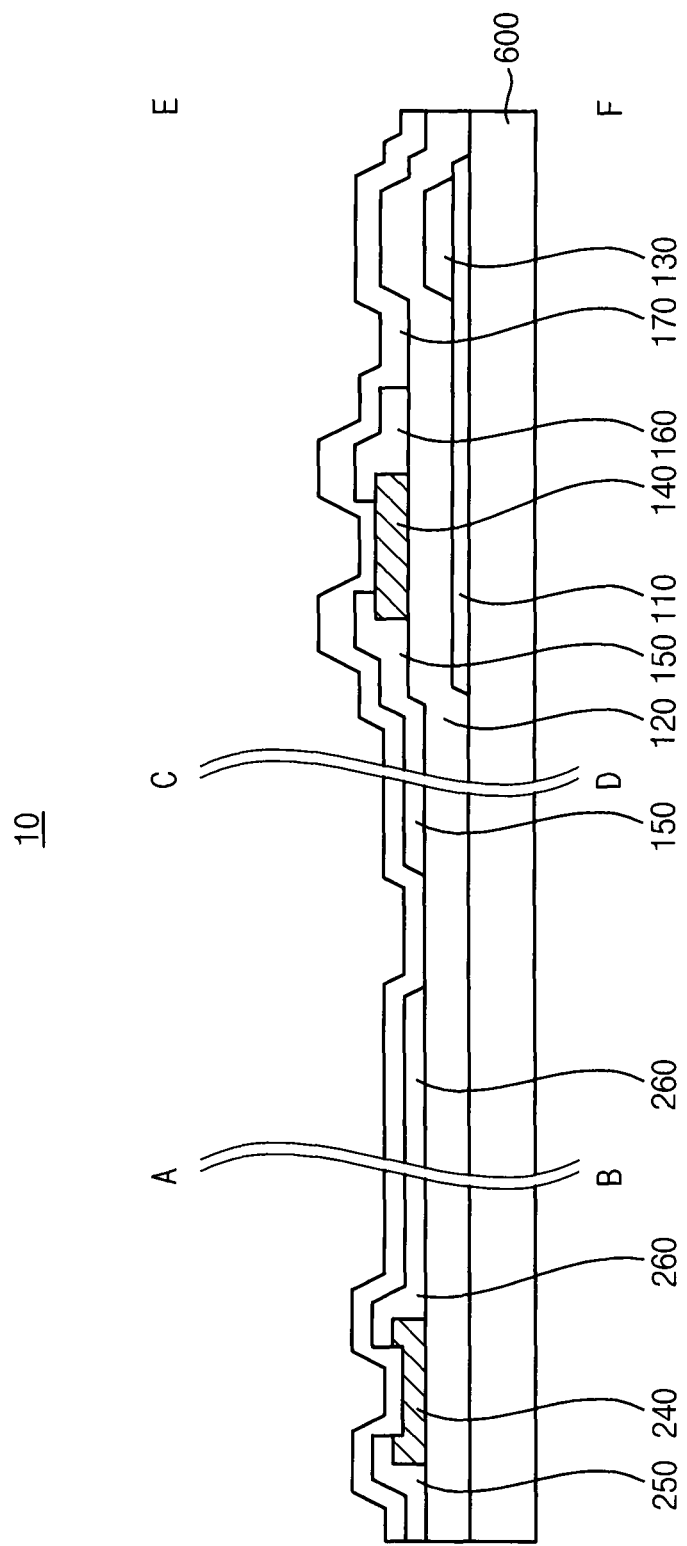

INFRARED DETECTOR, INFRARED DETECTION SENSOR HAVING AN INFRARED DETECTOR AND METHOD OF MANUFACTURING THE SAME

CROSS-REFERENCE TO RELATED APPLICATION

This application is a divisional of U.S. patent application Ser. No. 14/220,359, filed Mar. 20, 2014, which claims priority under 35 USC § 119 to Korean Patent Applications No. 10-2013-0134564, filed on Nov. 7, 2013 in the Korean Intellectual Property Office (KIPO), the content of which are incorporated herein in its entirety by reference.

BACKGROUND

Field

Example embodiments relate to an infrared detector, an infrared detection sensor including the infrared detector, and a method of manufacturing the infrared detection sensor.

Description of the Related Technology

An infrared detection sensor is a light detection device detecting a light having an infrared range (such as for example, about 780 nanometers (nm) through about 1500 nm). Infrared detection sensors are classified into thermal infrared sensors that detect the infrared ray by detecting physical variations induced by a thermal change when the infrared ray is incident, and photoelectric infrared sensors that detect the infrared ray using a semiconductor that generates a photocurrent by reacting with the infrared ray. Since photoelectric infrared sensors have relatively faster response rate and improved infrared detection performance, the photoelectric infrared sensors are widely used.

SUMMARY OF CERTAIN INVENTIVE ASPECTS

Some embodiments provide an infrared detector having improved infrared detection performance and having fast response rate.

Some embodiments provide an infrared detection sensor including the infrared detector.

Some embodiments provide a method of manufacturing the infrared detection sensor.

According to some embodiments, an infrared detector includes a substrate, a light blocking layer on the substrate, a lower electrode on the light blocking layer, the lower electrode electrically connected to the light blocking layer, a lower insulating layer on the light blocking layer, a first semiconductor layer on the lower insulating layer, a first source electrode and a first drain electrode on the first semiconductor layer, an upper insulating layer on the first semiconductor layer, and a first gate electrode on the upper insulating layer, the first gate electrode electrically connected to the lower electrode, where the first semiconductor layer includes a zinc and a nitrogen, and the first semiconductor layer is configured to generate electric charges by reacting with an infrared ray.

The first semiconductor layer may include the zinc in a range of about 46% to about 60% by atomic percent.

The first semiconductor layer may further include an oxygen.

An atomic ratio of the nitrogen to the oxygen in the first semiconductor layer may be about 1:0.01 to about 1:2.

The first semiconductor layer may have a thickness in a range of about 100 angstrom (Å) to about 1000 Å.

According to some embodiments, an infrared detection sensor includes a substrate, a switch on the substrate, and an infrared detector on the substrate, where the infrared detector is electrically connected to the switch, and the infrared detector includes a substrate, a light blocking layer on the substrate, a lower electrode on the light blocking layer, the lower electrode electrically connected to the light blocking layer, a lower insulating layer on the light blocking layer, a first semiconductor layer on the lower insulating layer, a first source electrode and a first drain electrode on the first semiconductor layer, an upper insulating layer on the first semiconductor layer, and a first gate electrode on the upper insulating layer, the first gate electrode electrically connected to the lower electrode, where the first semiconductor layer includes a zinc and a nitrogen, and the first semiconductor layer is configured to generate electric charges by reacting with an infrared ray.

The switch may include a thin film transistor including a second semiconductor layer, a second source electrode, a second drain electrode and a second gate electrode, and the second semiconductor layer includes a material the same as that of the first semiconductor layer.

Each of the first semiconductor layer and the second semiconductor layer may include the zinc in a range of about 46% to about 60% by atomic percent.

Each of the first semiconductor layer and the second semiconductor layer may further include an oxygen.

An atomic ratio of the nitrogen and the oxygen in each of the first semiconductor layer and the second semiconductor layer may be about 1:0.01 to about 1:2.

Each of the first semiconductor layer and the second semiconductor layer may have a thickness in a range of about 100 Å to about 1000 Å.

The lower insulating layer may include at least one a silicon oxide, a silicon nitride or a composition thereof, and the upper insulating layer may include at least one selected from a group consisting of a silicon oxide, a silicon nitride and a composition thereof.

The lower insulating layer may include a first lower insulating layer on the substrate to cover the light blocking layer, where the first lower insulating layer may include a silicon nitride, and a second lower insulating layer on the first lower insulating layer, where the second lower insulating layer may include a silicon oxide, and the upper insulating layer may include a first upper insulating layer on the substrate to cover the first semiconductor layer and the second semiconductor layer, where the first upper insulating layer may include a silicon nitride, and a second upper insulating layer on the first upper insulating layer, where the second upper insulating layer may include a silicon oxide.

According to some embodiments, a method of manufacturing an infrared detection sensor includes forming a light blocking layer on a substrate, forming a lower electrode on the light blocking layer, forming a lower insulating layer on the light blocking layer, forming a first semiconductor layer and a second semiconductor layer on the lower insulating layer, each of the first semiconductor layer and the second semiconductor layer including a zinc and a nitrogen, forming a first source electrode and a first drain electrode on the first semiconductor layer, forming a second source electrode and a second drain electrode on the second semiconductor layer, forming an upper insulating layer to cover the first source electrode, the first drain electrode, the second source electrode and the second drain electrode, forming a first gate electrode to cover the first semiconductor layer on the upper insulating layer, the first gate electrode electrically connected to the lower electrode, and forming a second gate electrode on the upper insulating layer to cover the second semiconductor layer.

Each of the first semiconductor layer and the second semiconductor layer may include the zinc in a range of about 46% to about 60% by atomic percent.

Each of the first semiconductor layer and the second semiconductor layer may further include an oxygen.

An atomic ratio of the nitrogen to the oxygen in each of the first semiconductor layer and the second semiconductor layer may be about 1:0.01 to about 1:2.

The first semiconductor layer and the second semiconductor layer may be formed by a sputtering process that uses the zinc as a target and injects a nitrogen gas and an argon gas.

Each of the first semiconductor layer and the second semiconductor layer may have a thickness in a range of about 100 Å to about 1000 Å.

An infrared detector according to embodiments may have improved infrared detection performance and may have fast mobility of the electrical charge. An infrared detection sensor according to embodiments may detect small infrared ray and may have fast response rate. In addition, a method of manufacturing the infrared detection sensor according to embodiments may provide an infrared detection sensor having improved infrared detection performance and having fast response rate.

BRIEF DESCRIPTION OF THE DRAWINGS

Illustrative, non-limiting example embodiments will be more clearly understood from the following detailed description taken in conjunction with the accompanying drawings.

FIG. 6 is a cross-sectional view illustrating an embodiment of a display panel including the infrared sensor of FIG. 3.

FIGS. 8A through 8G are cross-sectional views for describing an embodiment of a method of manufacturing the infrared sensor in accordance with the method of FIG. 7.

DETAILED DESCRIPTION OF CERTAIN INVENTIVE EMBODIMENTS

Figure 1:
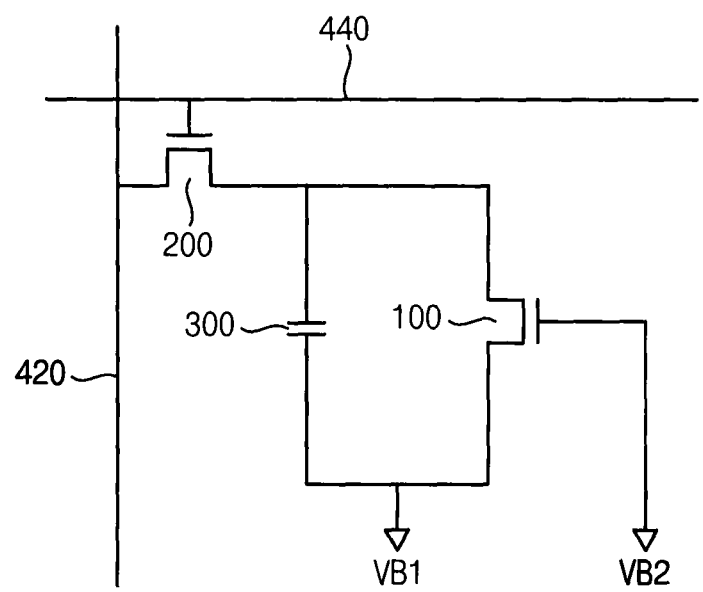
FIG. 1 is a circuit diagram illustrating an embodiment of an infrared sensor.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals generally refer to like elements throughout.

It will be understood that, although the terms first, second, third and the like may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (for example, "between" versus "directly between," "adjacent" versus "directly adjacent," and the like).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Recently, a display device including a touch-input function or an image sensing function has been researched and developed. In order to have these functions, a display device combined with the photoelectric infrared sensor has been suggested. However, in order to have fast and exact touch input function and image sensing functions, an improved photoelectric infrared sensor is desired. The photoelectric infrared sensor includes infrared detector that generates a photocurrent by reacting with the infrared ray. Since a semiconductor layer included in the infrared detector is formed with a silicon or an amorphous silicon having relatively greater band gap, the infrared detector may not sensitively react with the infrared ray. In addition, since a mobility of electrical charges induced by the infrared ray is relatively slow, a response rate of the infrared detector is relatively slow.

Figure 2:
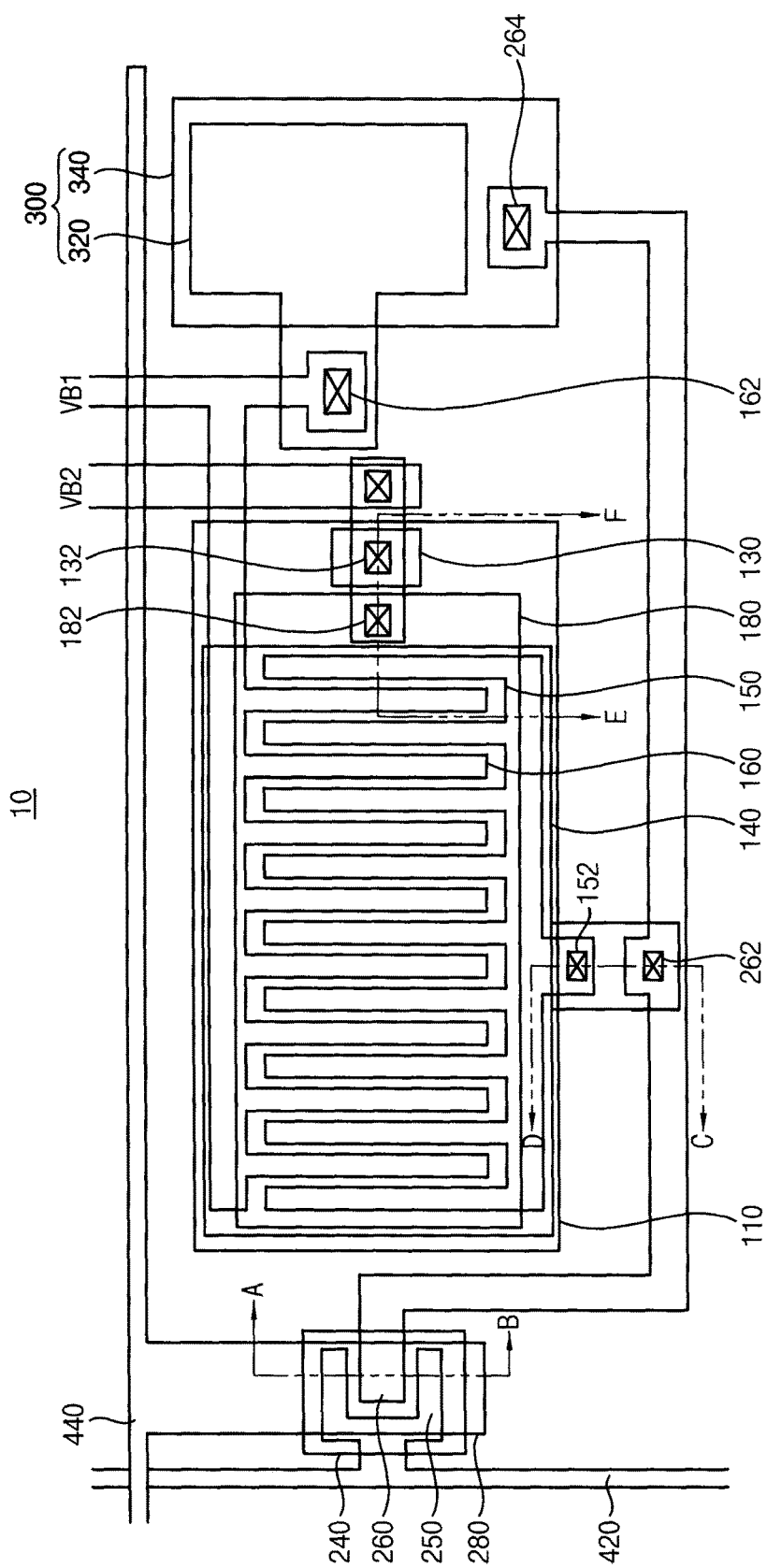
FIG. 2 is a planar view illustrating the infrared sensor of FIG. 1.
Figure 3:
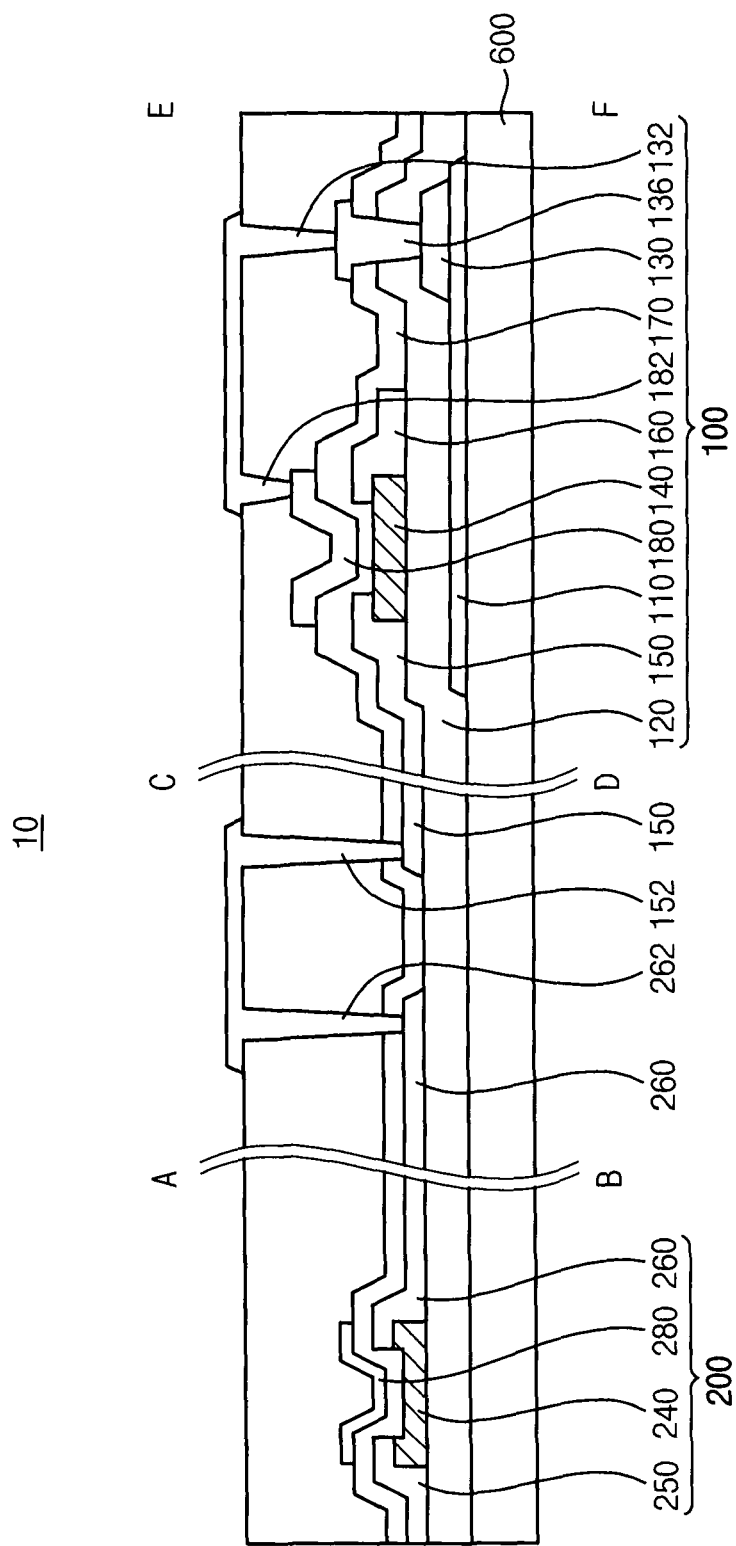
FIG. 3 is a cross-sectional view taken along lines A-B, C-D and E-F illustrating the infrared sensor of FIG. 2.

FIG. 1 is a circuit diagram illustrating an embodiment of an infrared sensor. FIG. 2 is a planar view illustrating the infrared sensor of FIG. 1. FIG. 3 is a cross-sectional view taken along lines A-B, C-D and E-F illustrating the infrared sensor of FIG. 2.

Referring to FIGS. 1 through 3, the infrared detection sensor 10 may include an infrared detector 100, a switch 200 and a storage capacitor 300. The infrared detection sensor 10 may detect an infrared ray to provide information about a detection position and an intensity of the infrared ray. The infrared detection sensor 10 according to the example embodiments may be a photoelectric infrared detection sensor. The infrared detection sensor 10 may apply to various devices, such as a touch-input device in the display panel, or the like. In some example embodiments, the infrared detection sensor 10 may include a plurality of the infrared detectors 100, a plurality of the switches 200 and a plurality of the storage capacitors 300 that are arranged along an x-direction and a y-direction at regular intervals. Groups including the infrared detectors 100, the switches 200 and the storage capacitors 300 may form a matrix.

As illustrated in FIGS. 1 and 3, a first signal line 420 electrically connected to a driving circuit, and a second signal line 440 crossing the first signal line 420 may be disposed on a substrate 600. The switch 200 may be electrically connected to the first signal line 420 and the second signal line 440, and the switch 200 may be electrically connected to the infrared detector 100 and the storage capacitor 300. A capacitor lower electrode of the storage capacitor 300 may be electrically connected to the switch 200, and a capacitor upper electrode of the storage capacitor 300 may be electrically connected to a third signal line VB1. The storage capacitor 300 may pre-charged to a data voltage. When the infrared ray is incident on the infrared detector 100, the infrared detector 100 may generate electrical charges (such as for example electrons and holes), and may generate photocurrents induced by the electrical charge. When a first gate signal is applied to a fourth signal line VB2, the infrared detector 100 is turned on, and a voltage of the storage capacitor 300 may be changed based on the photocurrent. Further, when a second gate signal is applied to the second signal line 440, the switch 200 may be turned on, and the storage capacitor 300 may be re-charged from the changed voltage to the data voltage. A touch-input analyzer included in the display panel may measure an amount of a charging current to the storage capacitor 300 and a position of the re-charged storage capacitor 300 to detect a touch-input position including an x-coordinate position and a y-coordinate position.

As illustrated in FIG. 3, the infrared detector 100 may include a light blocking layer 110 on the substrate 600, a lower electrode 130 on the light blocking layer 110, a lower insulating layer 120 on the light blocking layer 110, a first semiconductor layer 140 on the lower insulating layer 120, a first source electrode 150 and a first drain electrode 160 on the first semiconductor layer 140, an upper insulating layer 170 on the first semiconductor layer 140, and a first gate electrode 180 on the upper insulating layer 170.

The substrate 600 may support the infrared detector 100 and the switch 200, and the substrate 600 may block a permeation of moisture and oxygen. The substrate 600 may be formed with a transparent glass, a transparent polymer resin and/or a metal sheet. The transparent polymer resin may include at least one of polyacrylate, polyether imide (PEI), polyethylene naphthalate (PEN), polyimide and polycarbonate (PC), for example. The metal sheet may include at least one of an aluminum (Al), an alloy of the aluminum, a copper, and an alloy of copper, for example.

The light blocking layer 110 may be disposed on the substrate 600, and may block lights (such as for example visible light, ultraviolet ray, and the like) except for the infrared ray that is incident on the first semiconductor layer 140. Since the first semiconductor layer 140 may generate the electric charges by reacting with not only the infrared ray but also the visible light, the visible light incident on the first semiconductor layer 140 should be blocked. In some example embodiments, the light blocking layer 110 may block the lights including the visible light except for the infrared ray, thereby improving an infrared detection performance of the infrared detector 100. The light blocking layer 110 may include a material to efficiently block the lights except for the infrared ray. For example, the light blocking layer 110 may include an amorphous germanium (a—Ge), a silicon germanium (SeGe) and/or a combination thereof.

The lower electrode 130 may be disposed on the light blocking layer 110, and may be electrically connected to the light blocking layer 110. The lower electrode 130 may be electrically connected to the first gate electrode 180. For example, as illustrated in FIG. 3, the lower electrode 130 may be electrically connected to the first gate electrode 180 via a lower electrode contact unit 132 and a lower electrode pad 136 disposed on the lower electrode 130. The lower electrode 130 may be electrically connected to the light blocking layer 110 and the first gate electrode 180, so that the light blocking layer 110 may have substantially identical voltage level to a voltage level of the first gate electrode 180. Thus, the lower electrode 130 may prevent electrical floating of the light blocking layer 110. The lower electrode 130 may include a metal, a conductive metal oxide, a transparent conductive material, or the like. For example, the lower electrode 130 may include an aluminum, an alloy of aluminum, a silver (Ag), an alloy of silver, a tungsten (W), a copper, an alloy of copper, a nickel (Ni), a chrome (Cr), an molybdenum (Mo), an alloy of molybdenum, a platinum (Pt), an indium tin oxide (ITO), a tin oxide (SnOx), an indium oxide (InOx), a gallium oxide (GaOx), an indium zinc oxide (IZO) or a combination thereof. The lower electrode 130 may have a mono-layered structure or a multi-layered structure including the metal, the conductive metal oxide and/or the transparent material.

The lower insulating layer 120 may be disposed on the substrate 600 to cover the light blocking layer 110 and the lower electrode 130. The lower insulating layer 120 may improve a flatness of the substrate 600, and may block some impurities diffused from the substrate 600 when the first semiconductor layer 140 is formed. The lower insulating layer 120 may include an oxide, a nitride, an oxynitride, or the like. For example, the lower insulating layer 120 may include a silicon oxide (SiOx), a silicon nitride (SiNx), a silicon oxynitride (SiOxNy) or a combination thereof. In one embodiment, the lower insulating layer 120 may be formed to have a mono-layered structure including an oxide, a nitride, an oxynitride, or the like. In another embodiment, the lower insulating layer 120 may be formed to have a multi-layered structure including an oxide, a nitride, an oxynitride, and the like. For example, the lower insulating layer 120 may include a first lower insulating layer that covers the light blocking layer 110 and includes a silicon nitride, and a second lower insulating layer that is formed on the first lower insulating layer and includes a silicon oxide.

The first semiconductor layer 140 may be disposed on the lower insulating layer 120. The first semiconductor layer 140 may include, for example, a zinc and a nitrogen, and the first semiconductor layer 140 may generate electrical charges by reacting with the infrared ray. When the infrared ray is incident, electrons in a valance band of the first semiconductor layer 140 may jump to a conduction band, and holes in the conduction band of the first semiconductor layer 140 may jump to the valance band.

Generally, a semiconductor layer of the infrared detector includes an amorphous silicon (a —Si) or a silicon germanium (SiGe). In order to sensitively detect the infrared ray, the semiconductor layer should generate as many electrical charges as possible when the infrared ray is incident. The smaller the band gap between the conduction band and the valance band, the more easily electrical charge is generated. For example, the band gap energy (for example, about 1.8 electron volts (eV)) of the amorphous silicon may be reduced by injecting a germanium to the semiconductor layer including the amorphous silicon. However, when the germanium is injected at more than a predetermined atomic ratio, a characteristic of the infrared detector may be deteriorated. When the germanium is injected at more than a predetermined atomic ratio, some defects are generated in the semiconductor layer, and the electrical charges may be trapped in the defects. In this case, the infrared detector may not detect the infrared ray. For example, when the semiconductor layer includes the germanium at about two times by atomic ratio than the silicon, the semiconductor layer may lose a characteristic for infrared detection. Thus, the semiconductor layer including the amorphous silicon has a limitation of reducing the band gap.

In order to solve these prescribed problems, the infrared detector 100 according to the embodiments may include the first semiconductor layer 140 including, for example, a zinc and a nitrogen. For example, the first semiconductor layer 140 may include a zinc nitride (ZnxNy). In some example embodiments, the first semiconductor layer 140 may include the zinc nitride having the zinc in a range of about 46% to about 60% by atomic percentage (at %). The zinc nitride has a relatively small band gap, so that the zinc nitride may sensitively react with the infrared ray. In addition, the zinc nitride has a semiconducting characteristic, so that the zinc nitride is suitable for the first semiconductor layer 140 of the infrared detector 100. In one embodiment, the first semiconductor layer 140 may further include an oxygen (O) to improve the response rate of the infrared detector 100. For example, the first semiconductor layer 140 may be an oxide semiconductor layer including the zinc oxynitride. In some embodiments, the first semiconductor layer 140 may include the zinc oxynitrde having the zinc in a range of about 46 at % to about 60 at %. Since the oxide semiconductor layer have relatively faster mobility of electrical charge than a mobility of the semiconductor layer based on the silicon, the oxide semiconductor layer may have improved response rate. Thus, when the first semiconductor layer 140 of the infrared detector 100 has the zinc oxynitride, the response rate of the infrared detector 100 may be relatively faster. In addition, when the infrared detector 100 having fast response rate is applied to a touch-input device of the display panel, the display may detect the touch input more quickly. When the infrared detector 100 includes more oxygen, the response rate of infrared detector 100 may be relatively faster. However, the band gap of the first semiconductor layer 140 may be relatively greater. Thus, in order to have not only fast response rate but also small band gap, the first semiconductor layer 140 of the infrared detector 100 may have the nitrogen and the oxygen at a predetermined ratio. For example, an atomic ratio of the nitrogen to the oxygen in the first semiconductor layer 140 may be about 1:0 to about 1:2. When the first semiconductor layer 140 includes the nitrogen and the oxygen at 1:0 by atomic ratio, the first semiconductor layer 140 may not include the oxygen (i.e., only include the zinc nitride). According to example embodiments, the band gap of the first semiconductor layer 140 remains at less than about 1.5 eV or equal to about 1.5 eV, and the response rate of the infrared detection sensor 10 may be relatively faster than the response rate of the infrared detection sensor based on the silicon.

In one embodiment, the first semiconductor layer 140 may have a thickness in a range of about 100 angstrom (Å) to about 1000 Å. When the first semiconductor layer 140 has a thickness less than about 100 Å, a channel of the first semiconductor layer 140 may not be formed uniformly. When the first semiconductor layer 140 has a thickness greater than about 1000 Å, the infrared detector 100 may not be suitable for miniaturization.

Figure 4:
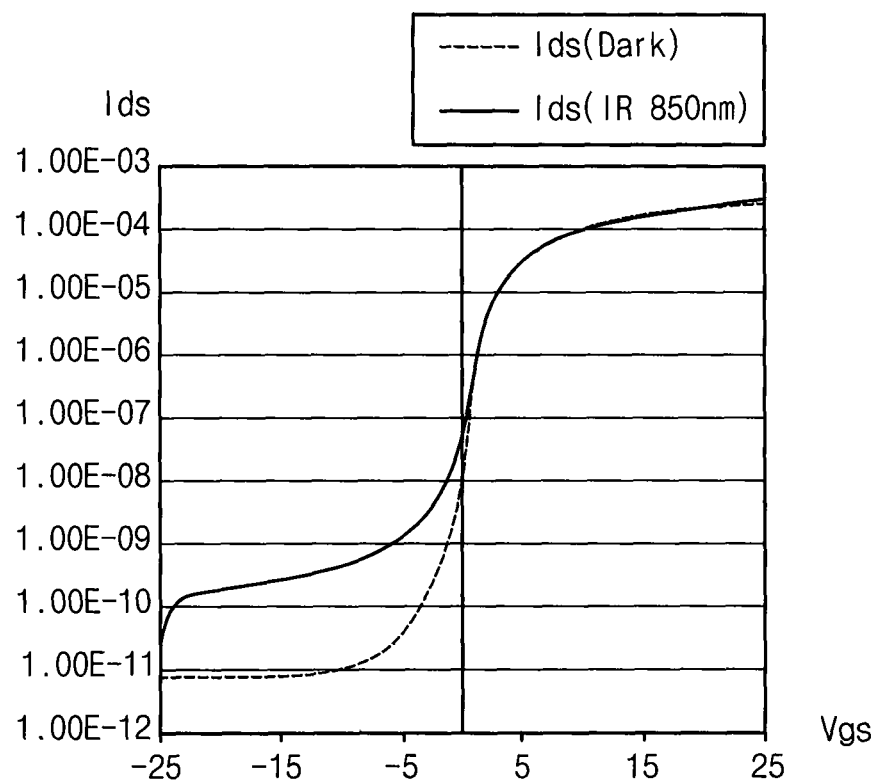
FIG. 4 is a graph illustrating variations of amount of current flowing from the first drain electrode to the first source electrode depending on a difference of voltage potentials between the first gate electrode and the first source electrode of the infrared detector included in the infrared detection sensor of FIG. 3.
Figure 5A:
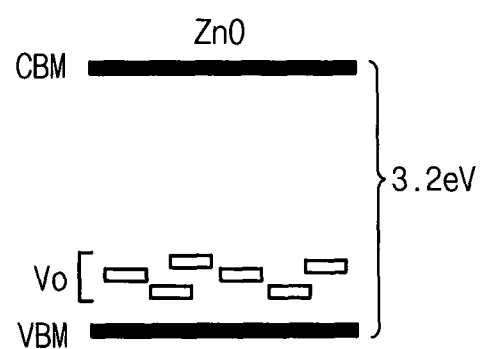
FIGS. 5A through 5C are energy band diagrams illustrating variations of band gap energies of the infrared detector included in the infrared sensor of FIG. 3.
Figure 5B:
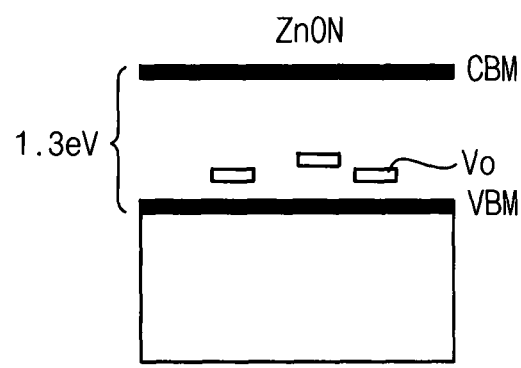
Figure 5C:
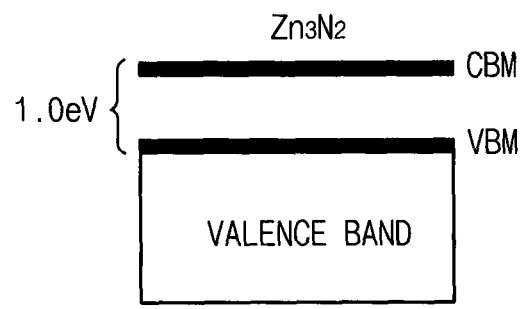

FIG. 4 is a graph illustrating variations of amount of current flowing from the first drain electrode 160 to the first source electrode 150 depending on a difference of voltage potentials between the first gate electrode 180 and the first source electrode 150 of the infrared detector included in the infrared detection sensor of FIG. 3. FIGS. 5A through 5C are energy band diagrams illustrating variations of band gap energies of the infrared detector included in the infrared sensor of FIG. 3.

Referring to FIG. 4, the first semiconductor layer 140 including the zinc oxynitride may generate sufficient photocurrent, when the infrared ray is incident. In FIG. 4, the first semiconductor layer 140 includes a zinc, an oxygen and a nitrogen at about 60:24:24 by atomic ratio (i.e., included a $Zn_{60}O_{24}N_{24}$), and the first semiconductor layer 140 has a thickness of about 500 Å. In addition, the first semiconductor layer 140 is formed to have a square cross-sectional plane, and a width and length ratio (W/L) of the cross-sectional plane of about 50/6. An incident infrared ray has a wavelength of about 850 nanometers (nm), and a difference of voltage levels Vds between the first drain electrode and the first source electrode is about 5.1V. In FIG. 4, the graph shows that a current Ids flowing to the first source electrode from the first drain electrode when the infrared ray is incident is increased by about $10^{1.5}$ times than the current when the infrared ray is not incident, where a difference of voltage levels Vgs between the first gate electrode and the first source electrode is in a range of −5V through −25V. Generally, the infrared detection performance of the infrared detector 100 is determined by the difference of the current Ids levels between a current at a state in which the infrared ray is incident and a current at a state in which the infrared ray is not incident, where the Vgs is a negative voltage level. The greater the difference of the current between the current at a state in which the infrared ray is incident and the current at the state in which the infrared ray is not incident is, the more improved the infrared detection performance. According to embodiments, in the first semiconductor layer 140 of FIG. 4, the current at the state in which the infrared ray is incident is greater by about 10 times than the current at the state in which the infrared ray is not incident, so that the first semiconductor layer 140 of FIG. 4 may have improved infrared detection performance. In addition, the first semiconductor layer 140 of FIG. 4 has mobility of the electrical charge at about 42.6 $cm^2V^{-1}s^{-1}$, and the mobility is relatively faster by about 40 times than about 0.05 $cm^2V^{-1}s^{-1}$ that is a mobility of a semiconductor layer including a silicon germanium. The mobility of the electrical charge means an area (for example in $cm^2$) in which the electrical charge moves per unit time (for example 1 second (s)) and unit voltage (for example 1 volt (V)). According to embodiments, the first semiconductor layer 140 may have not only improved infrared detection performance but also fast mobility of the electrical charge.

Referring to FIGS. 5A through 5C, the energy band diagrams show variations of band gap energies of the first semiconductor layer 140 changed by the nitrogen. The band gap of the first semiconductor layer 140 may be reduced by increasing a content of the nitrogen. As illustrated in FIG. 5A, the band gap of a semiconductor layer including the zinc oxide is relatively great (for example, about 3.2 eV), and an energy vacancy Vo induced by an oxygen vacancy near a valance band maximum (VBM) may be exist. In this case, the electrical charge induced by the infrared ray may be remained in the energy vacancy Vo, and the photocurrent may be remained although the infrared ray is not incident. The semiconductor layer including the zinc oxide may not react with the infrared ray immediately. Thus, the zinc oxide is not suitable to use in the infrared detector 100. However, as illustrated in FIGS. 5B and 5C, the energy vacancy Vo may be removed and the band gap may be reduced, by injecting the nitrogen, so that the prescribed problems may be solved. Since the band gap is reduced to less than about 1.5 eV and the energy vacancy is removed, the photocurrent may not be generated at a state in which the infrared ray is not incident. Thus, the first semiconductor layer 140 including the zinc and nitrogen may react with the infrared ray immediately, and the infrared detection performance may be improved. Variations of characteristic of the first semiconductor layer 140 according to a content of the oxygen and the nitrogen may be understood by referring to "Kim, H. et al. Anion control as a strategy to achieve high-mobility and high-stability oxide thin-film transistors. Sci. Rep. 3, 1459; DOI:10.1038/srep01459(2013)", the complete disclosure of which is hereby incorporated by reference. Thus, detailed descriptions related to the variations will be omitted hereinafter.

Referring to FIG. 3 again, the first source electrode 150 and the first drain electrode 160 may be disposed on the first semiconductor layer 140. For example, the first source electrode 150 and the first drain electrode 160 may be disposed on both sides of the first semiconductor layer 140. As illustrated in FIG. 2, the first source electrode 150 and the first drain electrode 160 may be disposed to cover portions of the first semiconductor layer 140 in an uneven shape in a planar view. In this case, portions of the first semiconductor layer in which the first source electrode 150 and the first drain electrode 160 are not disposed may be act as channel portions. The first source electrode 150 and the first drain electrode 160 may include a metal, a conductive metal oxide, a transparent conductive material, or the like. For example, the first source electrode 150 and the first drain electrode 160 may include an aluminum, an alloy of aluminum, a silver, an alloy of silver, a tungsten, a copper, an alloy of copper, a nickel, a chrome, an molybdenum, an alloy of molybdenum, a platinum, an indium tin oxide, a tin oxide, an indium oxide, a gallium oxide, an indium zinc oxide, and the like. The first source electrode 150 and the first drain electrode 160 may have a mono-layered structure or a multi-layered structure including the metal, the conductive metal oxide and/or the transparent material.

The upper insulating layer 170 may be disposed to cover the first source electrode 150 and the first drain electrode 160. The upper insulating layer 170 may include an insulating material the same as that of the lower insulating layer 120. The upper insulating layer 170 may include an oxide, a nitride, a combination thereof, or the like. For example, the upper insulating layer 170 may include at least one of a silicon oxide, a silicon nitride and a silicon oxynitride. In one embodiment, the upper insulating layer 170 may have a mono-layered structure including an oxide, a nitride, an oxynitride, or the like. In another embodiment, the lower insulating layer 120 may have a multi-layered structure including an oxide, a nitride, an oxynitride, and the like. For example, the upper insulating layer 170 may include a first upper insulating layer that covers the first semiconductor layer 140 and includes a silicon nitride, and a second upper insulating layer that includes a silicon oxide, on the first upper insulating layer.

The first gate electrode 180 may be disposed on the upper insulating layer 170. For example, the first gate electrode 180 may be disposed on the upper insulating layer 170 adjacent to the first semiconductor layer 140. The first gate electrode 180 may be disposed to be overlapped with the first semiconductor layer 140. The first gate electrode 180 may be electrically connected to the lower electrode 130. In one embodiment, the first gate electrode 180 may be electrically connected to the lower electrode 130 via a first gate contact unit 182. In such an embodiment, a voltage the same as a voltage applied to the first gate electrode 180 may be applied to the lower electrode 130, so that the light blocking layer 110 may not be electrically floating. In another embodiment, the first gate electrode 180 may be electrically connected to the lower electrode 130 directly through the upper insulating layer 170 and the lower insulating layer 120. The first gate electrode 180 may include a material the same as that of the lower electrode 130. In one embodiment, the first gate electrode 180 may include a metal, a conductive metal oxide, a transparent conductive material, and the like. For example, the first gate electrode 180 may include an aluminum, a silver, a tungsten, a copper, a nickel, a chrome, an molybdenum, a titanium, a platinum, an indium tin oxide, an indium zinc oxide, or the like. The first gate electrode 180 may have a mono-layered structure or a multi-layered structure including the metal, the conductive metal oxide and/or the transparent material.

Such an infrared detector 100 includes the first semiconductor layer 140 including the zinc and the nitrogen, so that the infrared detector 100 may have improved infrared detection performance and may have fast response rate. Thus, the infrared detector 100 may detect the infrared ray quickly.

As illustrated in FIG. 3, the switch 200 electrically connected to the infrared detector 100 may include a second semiconductor layer 240, a second source electrode 250, a second drain electrode 260 and a second gate electrode 280.

The switch 200 may be a thin film transistor (TFT). The switch 200 may include a top gate type TFT that includes the second gate electrode 280 disposed on the upper surface of the second semiconductor layer 240, or a bottom gate type TFT that includes the second gate electrode 280 disposed on lower surface of the second semiconductor layer 240.

The second semiconductor layer 240 may be disposed on the upper surface of the lower insulating layer 120. In one embodiment, the second semiconductor layer 240 may include a material the same as that of the first semiconductor layer 140. For example, the second semiconductor layer 240 may include a zinc and a nitrogen. In another embodiment, the second semiconductor layer 240 may include polysilicon, polysilicon having impurity, an amorphous silicon, an amorphous silicon having impurity, an oxide semiconductor, an oxide semiconductor having impurity, and/or a combination thereof.

The second source electrode 250 and the second drain electrode 260 may be disposed on the second semiconductor layer 240. For example, the second source electrode 250 and the second drain electrode 260 may be disposed on both sides of the second semiconductor layer 240. As illustrated in FIGS. 2 and 3, the second source electrode 250 and the second drain electrode 260 may be disposed to cover portions of the second semiconductor layer 240 in an uneven shape in a planar view. In this case, portions of the second semiconductor layer 240 in which the second source electrode 250 and the second drain electrode 260 are not disposed may act as channel portions. Since the second source electrode 250 and the second drain electrode 260 may include a material the same as that of the first source electrode 150 and the first drain electrode 160, duplicated descriptions related to the material will be omitted hereinafter.

The second gate electrode 280 may be disposed on the upper insulating layer 170 adjacent to the second semiconductor layer 240. The second gate electrode 280 may be disposed to be overlapped with the second semiconductor layer 240. Thus, the portion in which the second gate electrode 280 is overlapped with the second semiconductor layer 240 may act as a channel portion. Since the second gate electrode 280 may include a material the same as that of the first gate electrode 180, duplicated descriptions related to the material will be omitted hereinafter.

As illustrated in FIG. 2, the storage capacitor 300 may be electrically connected to the infrared detector 100 and the switch 200, and the storage capacitor 300 may include capacitor upper electrode 320 and capacitor lower electrode 340. The capacitor upper electrode 320 may be electrically connected to the third signal line VB1, and the capacitor lower electrode 340 may be electrically connected to the switch 200 and the infrared detector 100. The capacitor upper electrode 320 and the capacitor lower electrode 340 may include a metal, a metal nitride, a conductive metal oxide, a transparent conductive material, or the like.

FIG. 6 is a cross-sectional view illustrating an embodiment of a display panel including the infrared sensor of FIG. 3.

Referring to FIG. 6, the display panel 20 may include a lower substrate 500, a pixel element 700 and 800 disposed on an upper surface of the lower substrate 500, an upper substrate 600 opposing the lower substrate 500, a switch 200 disposed on a lower surface of the upper substrate 600, and an infrared detector 100 disposed on a lower surface of the upper substrate 600.

The display panel 20 may be an organic light emitting display (OLED) panel, a liquid crystal display (LCD) panel, a plasma display panel (PDP), and the like, according to types of the pixel element 700 and 800. FIG. 6 illustrates an OLED panel including an organic light emitting diode 800, as one of example of the display panel.

The lower substrate 500 may support the pixel element 700 and 800. In one embodiment, the lower substrate 500 may be an inorganic substrate including a glass or polysilicon. In another embodiment, the lower substrate 500 may be a plastic substrate including a polyethylene terephthalate (PET), a polyethylene naphthalate, a polyimide, or the like. In still another embodiment, the lower substrate 500 may be a flexible substrate including a flexible metal or a flexible polymer.

The pixel element 700 and 800 may include an organic light emitting diode 800 and pixel transistor 700. The organic light emitting diode 800 may include a pixel electrode 820, an opposite electrode 860 opposing the pixel electrode 820, and an organic light emitting layer 840 disposed between the pixel electrode 820 and the opposite electrode 860. The organic light emitting layer 840 may emit a light having specific wavelength by voltage applied to the pixel electrode 820 and the opposite electrode 860. The pixel transistor 700 may be electrically connected to the organic light emitting diode 800, and may include a third semiconductor layer 740, a gate insulating layer 770 disposed on the third semiconductor layer 740, a third gate electrode 780 disposed on the gate insulating layer 770, a third source electrode 750 and a third drain electrode 760 electrically connected to the third semiconductor layer 740. Since the pixel transistor 700 is substantially same as the switch 200 described above by referring to FIG. 3, the duplicated descriptions related to the pixel transistor 700 will be omitted hereinafter.

The upper substrate 600 opposes the lower substrate 500. The infrared detection sensor including the switch 200 and the infrared detector 100 may be disposed on a lower surface of the upper substrate 600. In one embodiment, the infrared detection sensor may be applied to the touch-input device in the display panel 20. As described above, when the upper substrate 600 is contacted to some material such as a finger, a light that is emitted from the organic light emitting diode 800 may be reflected to the material. The infrared detection sensor may detect the touch input and touch input position, by detecting a reflected infrared ray. Since the infrared detection sensor is substantially same as the infrared detection sensor 10 described above with reference to FIG. 3, duplicated descriptions related to the infrared detection sensor will be omitted hereinafter.

Figure 7:
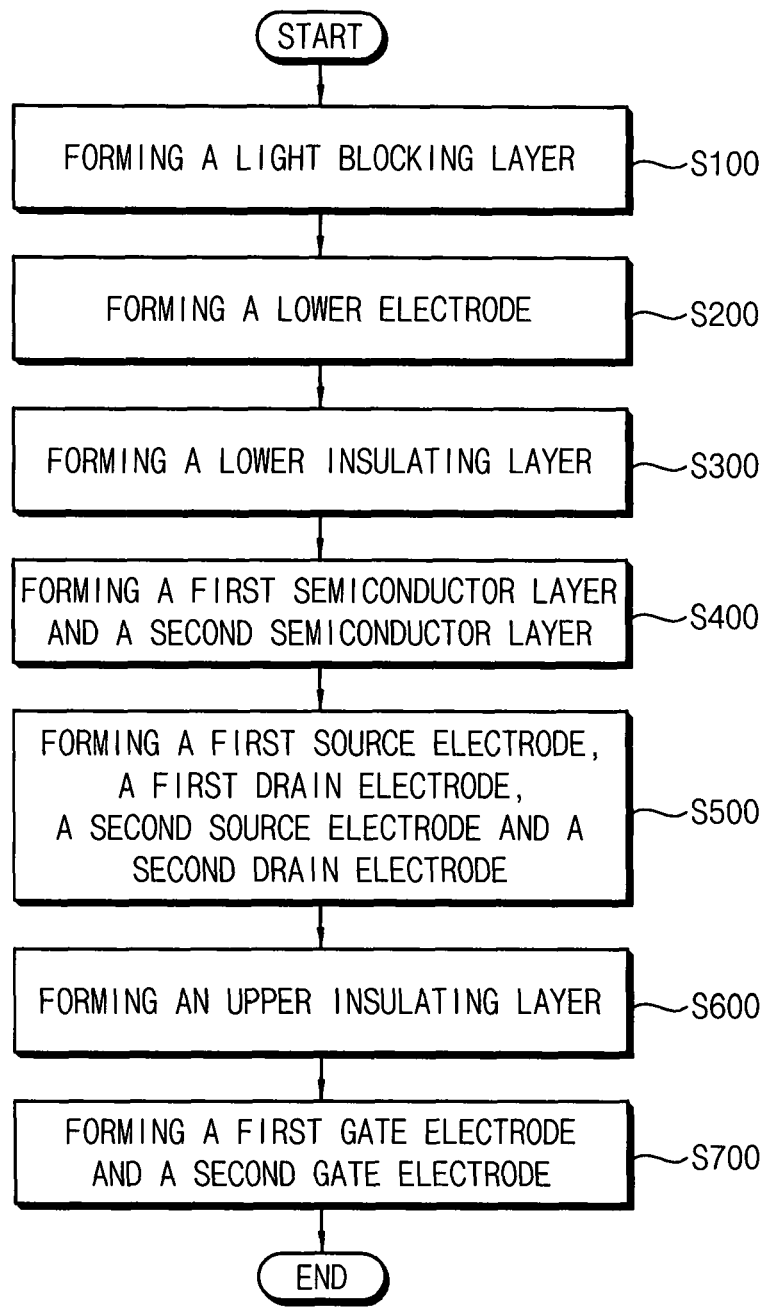
FIG. 7 is a flow chart illustrating an embodiment of a method of manufacturing an infrared sensor.

FIG. 7 is a flow chart illustrating an example of method of manufacturing an infrared sensor. FIGS. 8A through 8G are cross-sectional views for describing an embodiment of a method of manufacturing the infrared sensor in accordance with the method of FIG. 7.

Figure 8A:
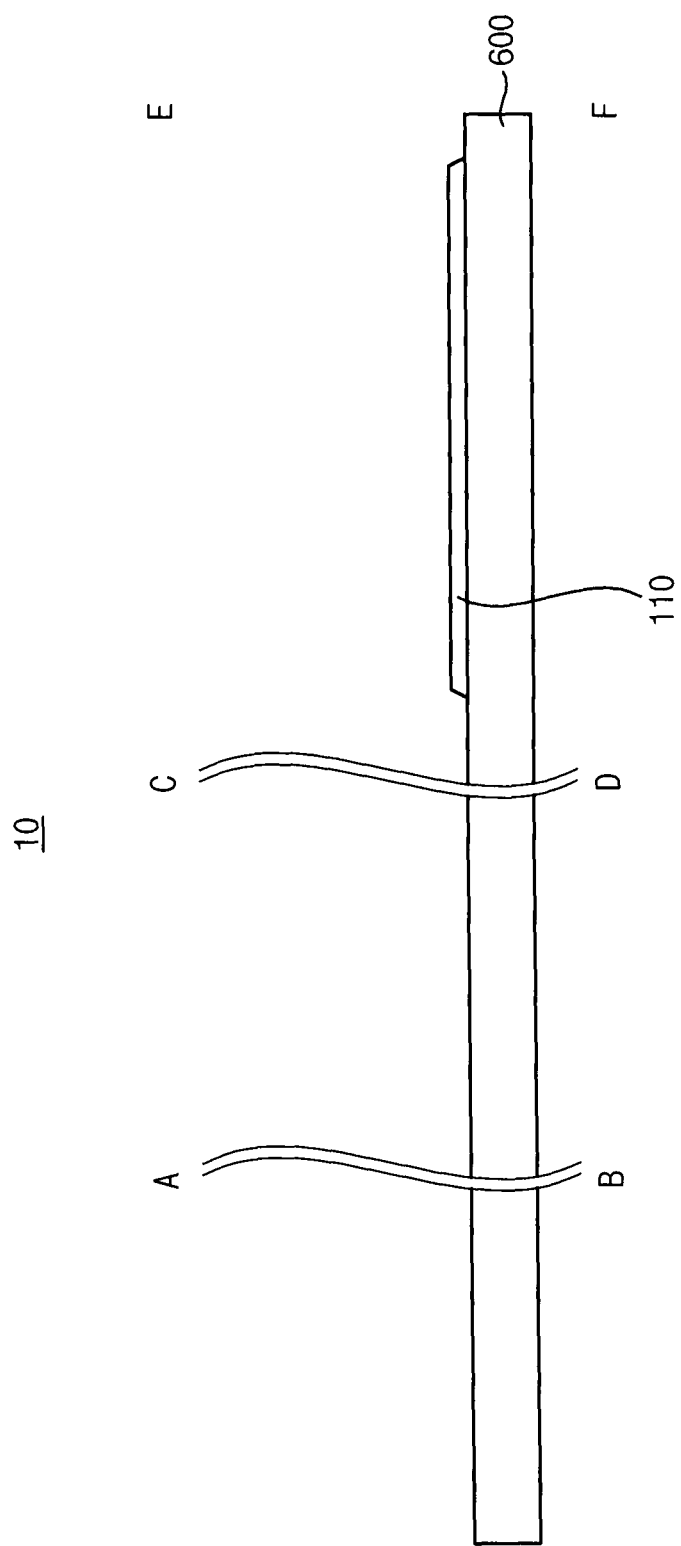
Figure 8B:
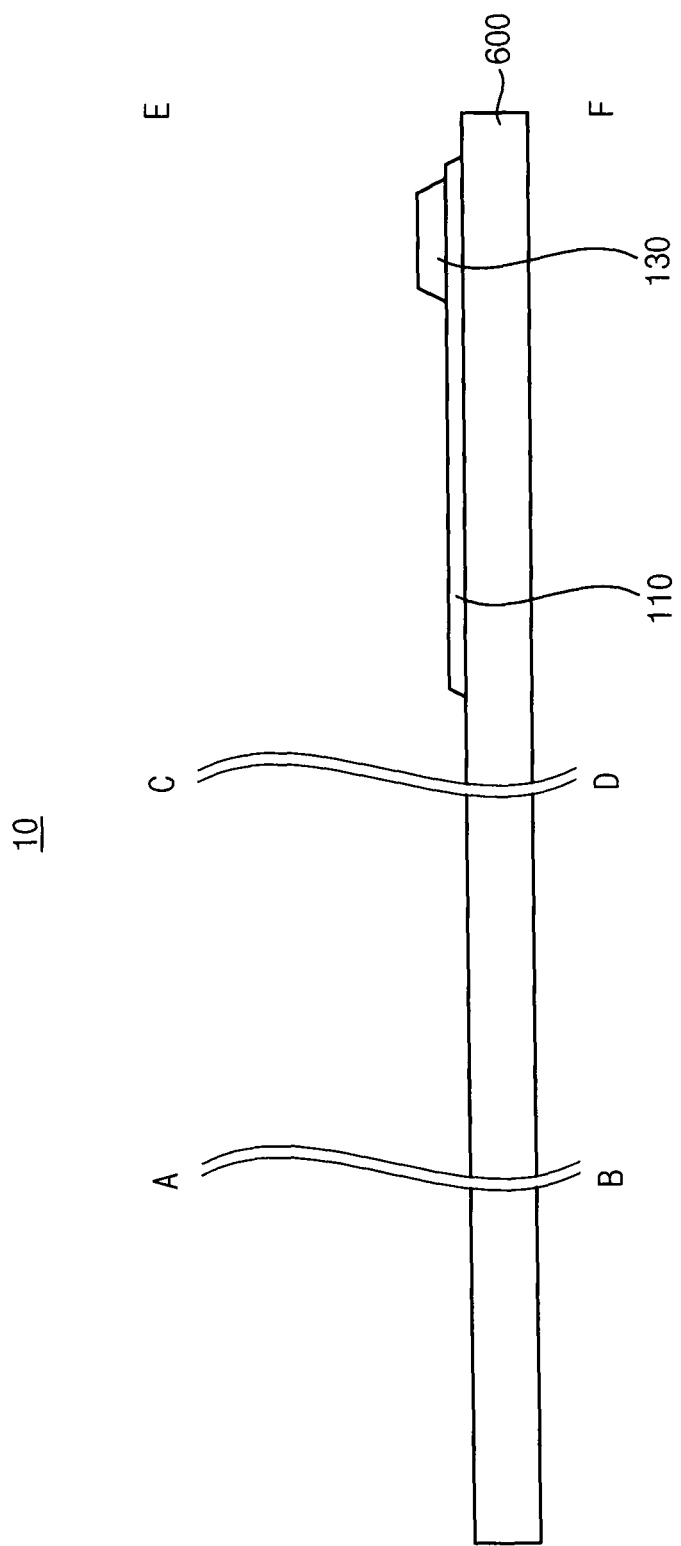
Figure 8C:
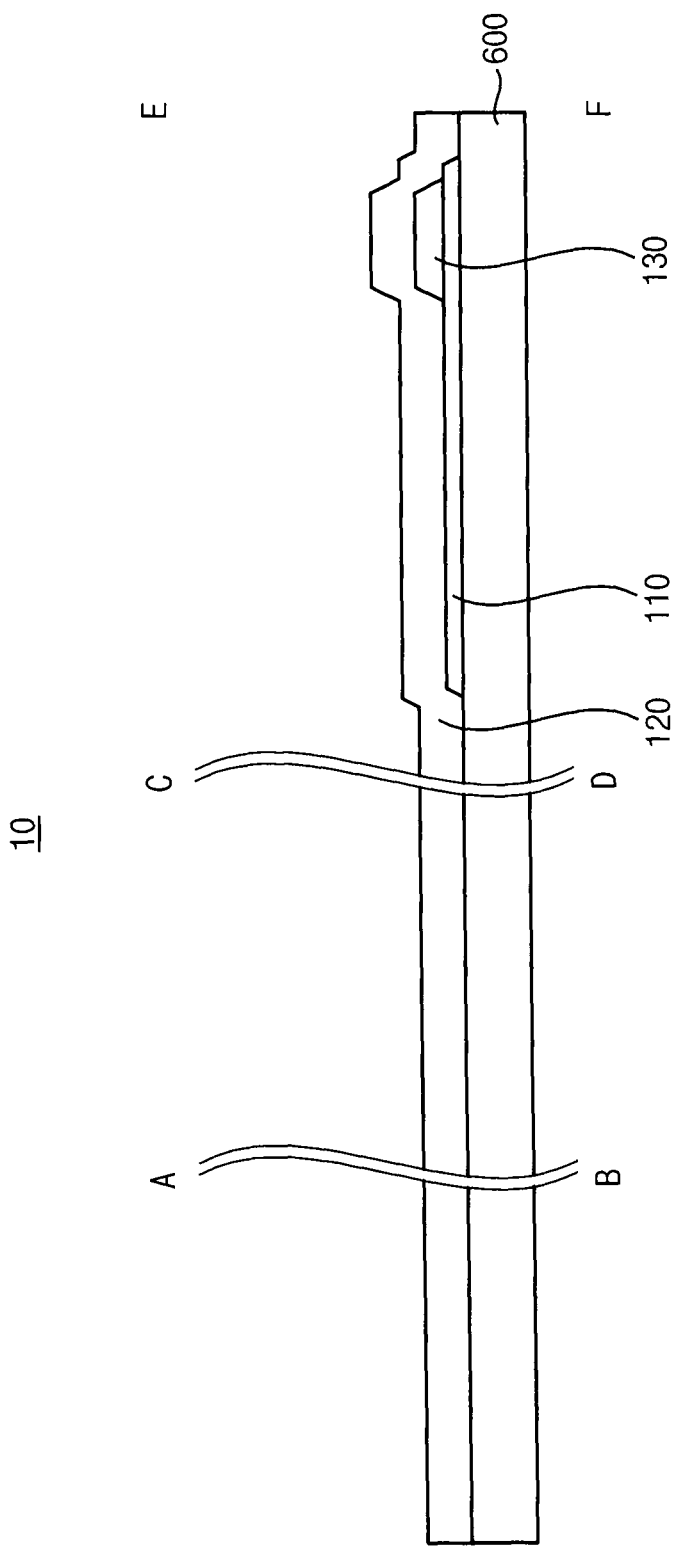
Figure 8D:
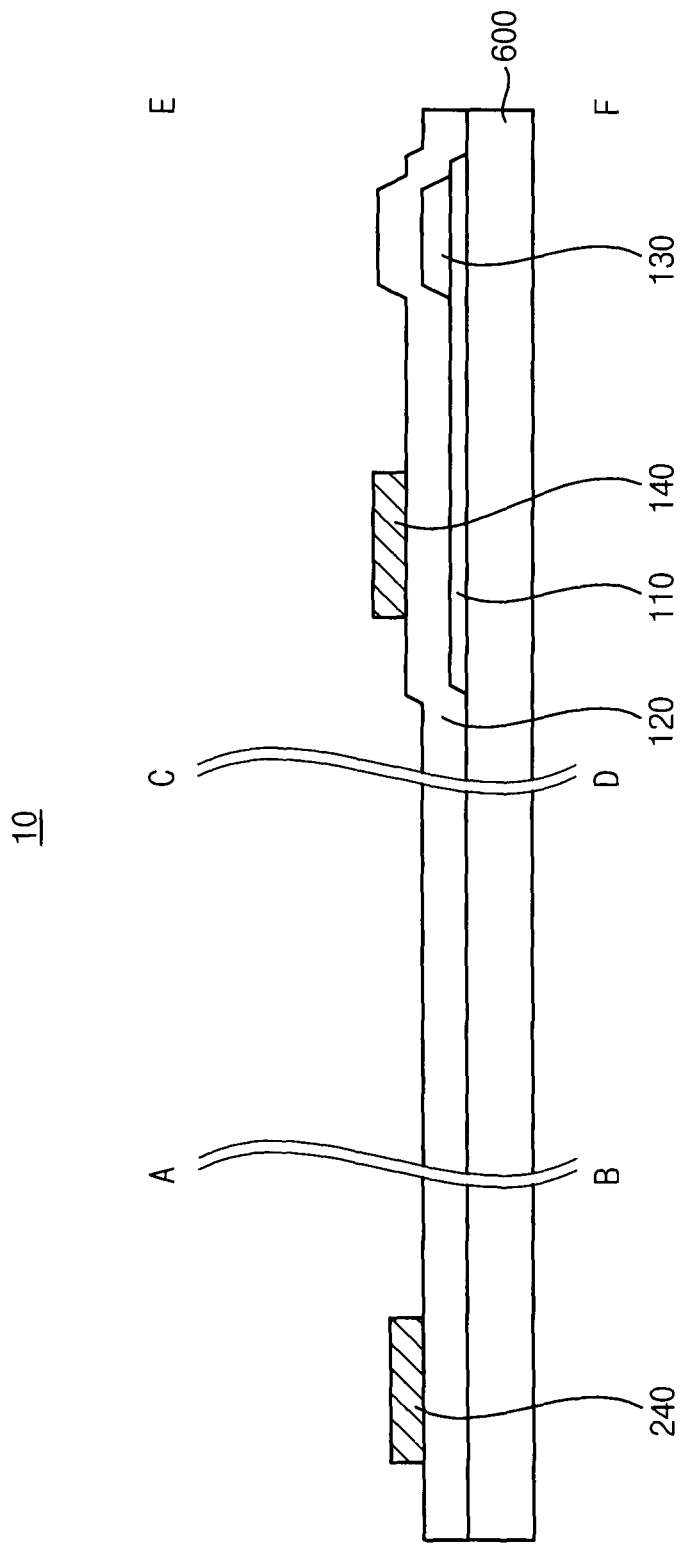
Figure 8E:
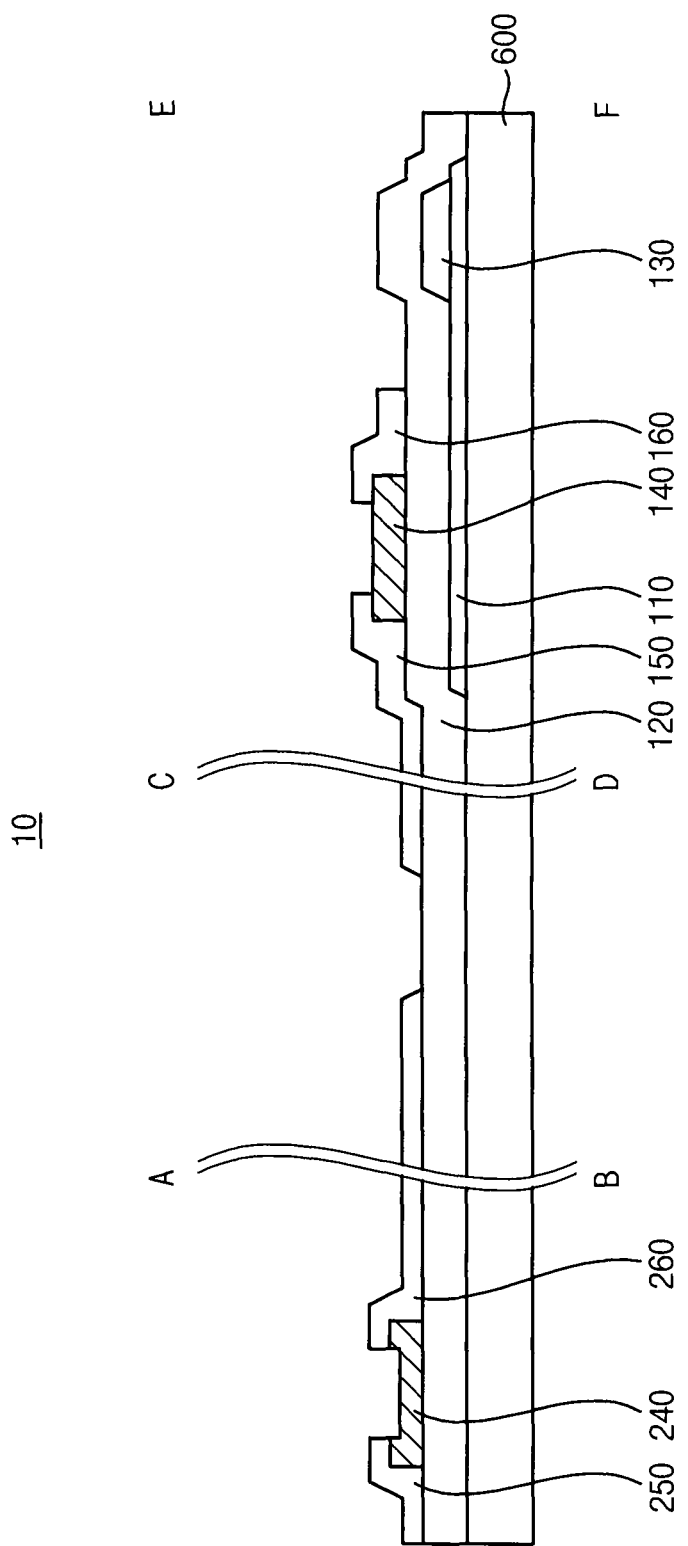
Figure 8G:
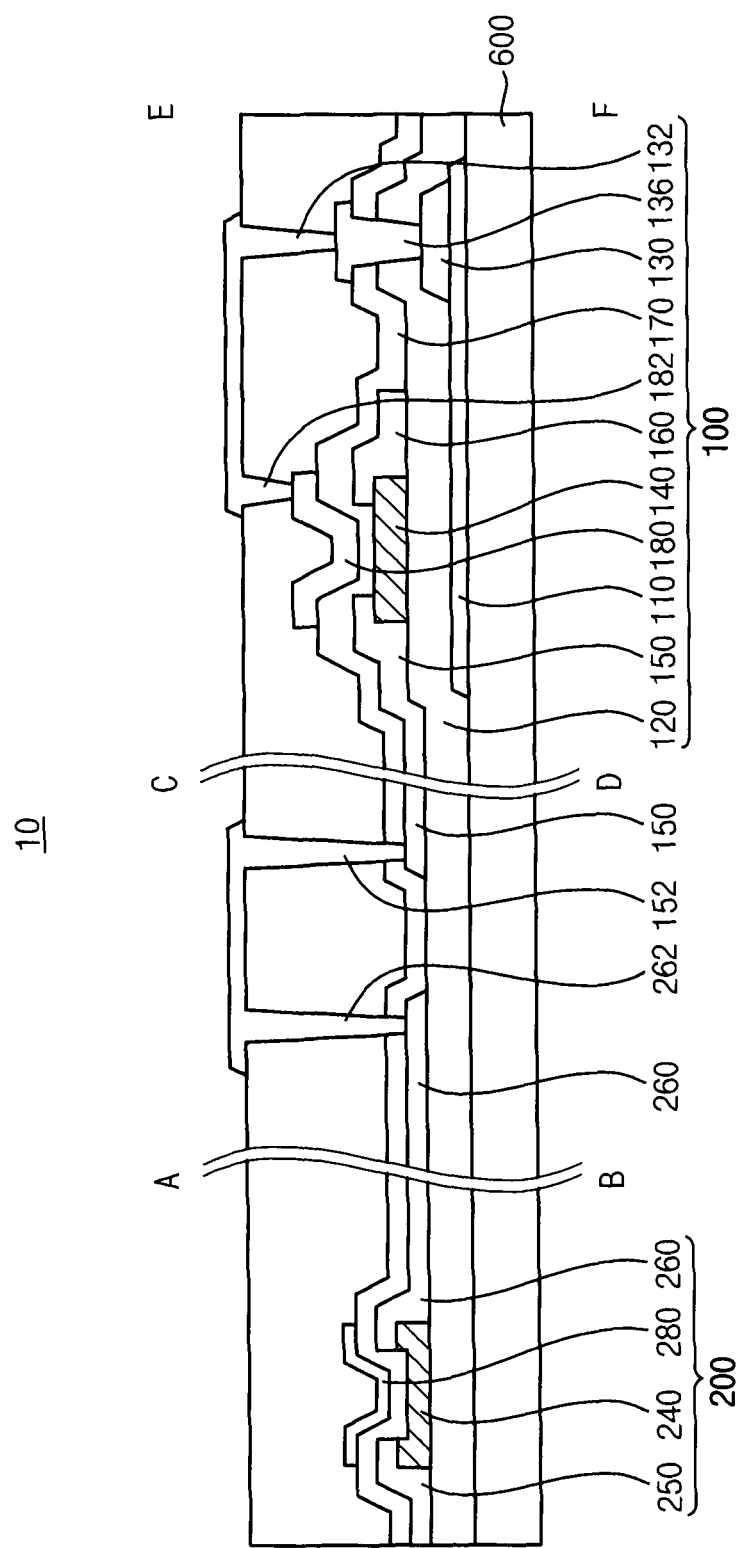

Referring to FIGS. 7 through 8G, the method of FIG. 7 may include forming a light blocking layer on a substrate (S100), forming a lower electrode on the light blocking layer (S200), forming a lower insulating layer on the light blocking layer (S300), forming a first semiconductor layer and a second semiconductor layer, by using a zinc and a nitrogen, on the lower insulating layer (S400), forming a first source electrode and a first drain electrode on the first semiconductor layer, forming a second source electrode and a second drain electrode on the second semiconductor layer (S500), forming an upper insulating layer to cover the first source electrode, the first drain electrode, the second source electrode and the second drain electrode (S600), forming a first gate electrode to cover the first semiconductor layer, to be electrically connected to the lower electrode, and forming a second gate electrode to cover the second semiconductor layer (S700).

As illustrated in FIG. 8A, the light blocking layer 110 may be formed on the substrate 600. The light blocking layer 110 may be formed by using an amorphous germanium, a silicon germanium and/or a combination thereof. The light blocking layer 110 may be formed by a sputtering process, a chemical vapor deposition (CVD) process, an atomic layer deposition (ALD) process, a spin coating process, a vacuum deposition process, a pulsed-laser-deposition (PLD) process, a printing process, or the like.

As illustrated in FIG. 8B, the lower electrode 130 may be formed on the light blocking layer 110. The lower electrode 130 may be formed by using a metal, a conductive metal oxide, a transparent conductive material. The lower electrode 130 may be formed by a sputtering process, a CVD process, an atomic layer deposition process, a spin coating process, a vacuum deposition process, a PLD process, a printing process, or the like.

As illustrated in FIG. 8C, the lower insulating layer 120 to cover the light blocking layer 110 and the lower electrode 130 may be formed on the substrate 600. The lower insulating layer 120 may be formed by using an oxide, a nitride, an oxynitride, or the like. The lower insulating layer 120 may be formed by a CVD process, a plasma-enhanced CVD (PECVD) process, a high-density-plasma CVD (HDP-CVD) process, a spin coating process, a thermal oxidation process, a printing process, or the like. In one embodiment, the lower insulating layer 120 may be formed to have a mono-layered structure including an oxide, a nitride, an oxynitride, or the like. In another embodiment, the lower insulating layer 120 may be formed to have a multi-layered structure including an oxide, a nitride, an oxynitride, or the like. For example, a first lower insulating layer to cover the light blocking layer 110 may be formed by using a silicon nitride, and a second lower insulating layer to cover the first lower insulating layer may be formed by using a silicon oxide.

As illustrated in FIG. 8D, the first semiconductor layer 140 and the second semiconductor layer 240 may be formed on the lower insulating layer 120. The first semiconductor layer 140 may be formed on the light blocking layer 110, and the first semiconductor layer 140 may be formed to be included in an area in which the light blocking layer 110 is formed. The first semiconductor layer 140 and the second semiconductor layer 240 may be formed with a zinc and a nitrogen. For example, the first semiconductor layer 140 and the second semiconductor layer 240 may be formed by the sputtering process that uses the zinc as a target, uses the nitrogen gas and an argon gas. For example, the sputtering process may include mounting the substrate 600 on a susceptor in a chamber of the sputtering system, forming a plasma in an interval of two targets that are opposite each other and include the zinc, generating the zinc ion and the nitrogen ion by injecting the argon gas and the nitrogen gas, and depositing the zinc ion and the nitrogen ion on the substrate 600. The first semiconductor layer 140 and the second semiconductor layer 240 may be formed by the sputtering process. However, the method of forming the first semiconductor layer 140 and the second semiconductor layer 240 is not limited by the sputtering process described above. The first semiconductor layer 140 and the second semiconductor layer 240 may be formed by a CVD process, a PECVD process, a HDP-CVD process, a spin coating process, a thermal oxidation process, a printing process, or the like. In one embodiment, the first semiconductor layer 140 and the second semiconductor layer 240 may be formed by further using an oxygen. The first semiconductor layer 140 and the second semiconductor layer 240 may be formed by using the zinc, the nitrogen and the oxygen. For example, the first semiconductor layer 140 and the second semiconductor layer 240 may be formed by the sputtering process that uses the zinc as a target and uses the nitrogen gas, the oxygen gas and the argon gas. In one embodiment, each of the first semiconductor layer 140 and the second semiconductor layer 240 may be formed by using substantially different materials. For example, the first semiconductor layer 140 may be formed by using the zinc, the nitrogen, and the oxygen. The second semiconductor layer 240 may be formed by using polysilicon, polysilicon having impurity, an amorphous silicon, an amorphous silicon having impurity, an oxide semiconductor, an oxide semiconductor having impurity, and/or a combination thereof.

As illustrated in FIG. 8E, the first source and drain electrode 150 and 160 to cover portions of the first semiconductor layer 140, and the second source and drain electrode 250 and 260 to cover portions of the second semiconductor layer 240 may be formed. Each of the first source electrode 150, the first drain electrode 160, the second source electrode 250 and the second drain electrode 260 may be formed by using a metal, a conductive metal oxide, a transparent conductive material, or the like. The first source electrode 150, the first drain electrode 160, the second source electrode 250 and the second drain electrode 260 may be formed at once. For example, the first source electrode 150, the first drain electrode 160, the second source electrode 250 and the second drain electrode 260 may be formed by forming a first conductive layer to cover the first semiconductor layer 140 and the second semiconductor layer 240 by using the metal, and patterning the first conductive layer by photolithography. The first conductive layer may be formed by a sputtering process, a CVD process, a PECVD process, an ALD process, a spin coating process, a vacuum deposition process, a PLD process, a printing process, or the like.

As illustrated in FIG. 8F, the upper insulating layer 170 may be formed to cover the first source electrode 150, the first drain electrode 160, the second source electrode 250 and the second drain electrode 260. The upper insulating layer 170 may be formed by a method the same as that of forming the lower insulating layer 120. For example, the upper insulating layer 170 may be formed by using an oxide, a nitride, an oxynitride, or the like. The upper insulating layer 170 may be formed by a CVD process, a PECVD process, a HDP-CVD process, a spin coating process, a thermal oxidation process, a printing process, or the like. In one embodiment, the upper insulating layer 170 may be formed to have a mono-layered structure including an oxide, a nitride, an oxynitride, or the like. In another embodiment, the upper insulating layer 170 may be formed to have a multi-layered structure including an oxide, a nitride, an oxynitride, or the like. For example, a first upper insulating layer to cover the first source electrode 150, the first drain electrode 160, the second source electrode 250 and the second drain electrode 260 may be formed by using a silicon nitride, and a second upper insulating layer to cover the first upper insulating layer may be formed by using a silicon oxide.

As illustrated in FIG. 8G, the first gate electrode 180 to be overlapped with the first semiconductor layer 140, and the second gate electrode 280 to be overlapped with the second semiconductor layer 240, may be formed on the upper insulating layer 170. Since the first gate electrode 180 and the second gate electrode 280 may be formed by a method the same as that of forming the first source electrode 150, the first drain electrode 160, the second source electrode 250 and the second drain electrode 260, duplicated descriptions related to the method will be omitted hereinafter.

In one embodiment, the method of FIG. 7 may further include forming a hole exposing the lower electrode 130 while the first gate electrode 180 and the second gate electrode 280 are formed, and forming a lower electrode pad 136 being electrically connected to the lower electrode 130. The lower electrode pad 136 may include a metal silicide layer formed by silicide reaction by a silicon and a metal.

In one embodiment, the method of FIG. 7 may further include forming a planarizing insulation layer to cover the first gate electrode 180 and the second gate electrode 280, to planarize an upper surface of the infrared detector 100 and the switch 200. The planarizing insulation layer may be formed by using a transparent insulating material. The planarizing insulation layer may be formed by a spin coating process, a printing process, a vacuum deposition process, or the like.

In one embodiment, the method of FIG. 7 may further include forming holes exposing the first gate electrode 180 and the lower electrode pad 136 by partially etching the planarizing insulation layer, and forming a gate bridge (132 and 182) filling the holes. The gate bridge (132 and 182) may be electrically connected to the first gate electrode 180 and the lower electrode 136 and the gate bridge (132 and 182) may include a first gate contact unit 182 and a lower electrode contact unit 132. The gate bridge 132 and 182 may be formed with a metal having relatively low resistance.

In one embodiment, the method of FIG. 7 may further include forming a switching bridge (152 and 262), while the gate bridge (132 and 182) is formed. The switching bridge (152 and 262) may be electrically connected to the switch 200 and the infrared detector 100, and the switching bridge (152 and 262) may include a second drain contact unit 262 electrically connected to the second drain electrode 260 of the switch 200 and a first source contact unit 152 electrically connected to the first source electrode 150 of the infrared detector 100. The gate bridge (132 and 182) and the switching bridge (152 and 262) may be formed at once by using substantially identical metals.

In one embodiment, the first gate electrode 180 may be directly contact to the lower electrode pad 136 without the gate bridge (132 and 182), and the second drain electrode 260 of the switch 200 may be directly contact to the first source electrode 150 of the infrared detector 100 without the switching bridge (152 and 262).

As described above, the infrared detection sensor 10 may be manufactured by the method of FIG. 7. The method of FIG. 7 may form the first semiconductor layer 140 and the second semiconductor layer 240 with substantially the same material, so that the method of FIG. 7 may simplify a process of manufacturing the infrared detection sensor 10. In addition, the infrared detector 100 has improved response rate and improved infrared detection performance, so that the method of FIG. 7 may manufacture the infrared detection sensor 10 detecting the infrared ray quickly.

Although a few example embodiments have been described, those skilled in the art will readily appreciate that many modifications are possible in the example embodiments without materially departing from the novel teachings and advantages of the present inventive concept.

The present inventive concept may be applied to any light detection device. For example, the present inventive concept may be applied to a touch-input device of a display panel, a security device for detecting a trespassing in a building, an infrared camera, and the like.

The foregoing is illustrative of example embodiments and is not to be construed as limiting thereof. Although certain embodiments have been described, those skilled in the art will readily appreciate that many modifications are possible without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing an infrared detection sensor comprising:
   forming a light blocking layer on a substrate;
   forming a lower electrode on the light blocking layer;
   forming a lower insulating layer on the light blocking layer, wherein the lower insulating layer includes:
      a first lower insulating layer on the substrate, the first lower insulating layer configured to cover the light blocking layer and including a silicon nitride; and
      a second lower insulating layer on the first lower insulating layer, the second lower insulating layer including a silicon oxide;
   forming a first semiconductor layer and a second semiconductor layer on the lower insulating layer, each of the first semiconductor layer and the second semiconductor layer including a zinc and a nitrogen;
   forming a first source electrode and a first drain electrode on the first semiconductor layer;
   forming a second source electrode and a second drain electrode on the second semiconductor layer;
   forming an upper insulating layer to cover the first source electrode, the first drain electrode, the second source electrode and the second drain electrode, wherein the upper insulating layer includes:
      a first upper insulating layer on the substrate, the first upper insulating layer configured to cover the first semiconductor layer and including a silicon nitride; and
      a second upper insulating layer on the first upper insulating layer, the second upper insulating layer including a silicon oxide;
   forming a first gate electrode to cover the first semiconductor layer on the upper insulating layer, the first gate electrode electrically connected to the lower electrode; and
   forming a second gate electrode on the upper insulating layer to cover the second semiconductor layer.

2. The method of claim 1, wherein each of the first semiconductor layer and the second semiconductor layer includes the zinc in a range of about 46 at % to about 60 at %.

3. The method of claim 2, wherein each of the first semiconductor layer and the second semiconductor layer further includes an oxygen.

4. The method of claim 3, wherein an atomic ratio of the nitrogen to the oxygen in each of the first semiconductor layer and the second semiconductor layer is about 1:0.01 to about 1:2.

5. The method of claim 1, wherein the first semiconductor layer and the second semiconductor layer are formed by a sputtering process that uses the zinc as a target and injects a nitrogen gas and an argon gas.

6. The method of claim 1, wherein each of the first semiconductor layer and the second semiconductor layer has a thickness in a range of about 100 Å to about 1000 Å.

* * * * *